(12) United States Patent
Mak et al.

(10) Patent No.: US 6,680,626 B2
(45) Date of Patent: Jan. 20, 2004

(54) HIGH SPEED DIFFERENTIAL RECEIVER

(75) Inventors: Chit-Ah Mak, Fremont, CA (US);
Bingda B. Wang, Milpitas, CA (US);
Eric West, San Jose, CA (US); Robert A. Olah, Sunnyvale, CA (US)

(73) Assignee: Lightspeed Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 10/161,931

(22) Filed: Jun. 5, 2002

(65) Prior Publication Data

US 2003/0227299 A1 Dec. 11, 2003

(51) Int. Cl.[7] ................................................ H03K 5/22
(52) U.S. Cl. ......................................... 327/65; 327/77
(58) Field of Search .............................. 327/52–57, 63, 327/65–67, 77, 309, 321

(56) References Cited

U.S. PATENT DOCUMENTS

| | | | | |
|---|---|---|---|---|
| 4,443,717 A | * | 4/1984 | Hague | ......................... 327/85 |
| 5,184,089 A | * | 2/1993 | Van Gorsel | ................. 330/254 |
| 5,764,086 A | * | 6/1998 | Nagamatsu et al. | .......... 327/65 |
| 5,796,273 A | * | 8/1998 | Jung et al. | ..................... 327/55 |
| 6,078,802 A | * | 6/2000 | Kobayashi | .................. 327/356 |
| 6,373,782 B1 | * | 4/2002 | Ikeda | .......................... 327/55 |
| 6,441,649 B1 | * | 8/2002 | Martin et al. | .................. 327/52 |

* cited by examiner

Primary Examiner—My-Trang Nu Ton
(74) Attorney, Agent, or Firm—Sarah Barone Schwartz Quirk & Tratos

(57) ABSTRACT

A differential receiver having a pair of cross-coupled signal conditioning devices improves transition time and data signal integrity. In an embodiment, the differential receiver includes two signal input nodes and a plurality of transistors, and two signal output nodes. The pair of cross-coupled signal conditioning devices are coupled to the transistors and function to reduce voltage swing between the two output nodes, thereby keeping the transistors in a saturation region.

10 Claims, 5 Drawing Sheets

HIGH SPEED DIFFERENTIAL RECEIVER

FIELD OF THE INVENTION

The present invention generally relates to differential receivers, and more particularly to high speed CMOS differential receivers.

BACKGROUND

FIG. 1 illustrates an example of a data signal 10 represented by differential signals 12 and 14, which are opposite of one another. When data signal 10 transitions from a logic low 11 to a logic high 13 differential signal 12 transitions from a high value 15 to a low value 16 and differential signal 14 transitions from a low value 17 to a high value 18, each signal remaining opposite of the other. This transition represents a change in data, which can be converted to a single output signal.

Typically, a wide band differential receiver is used to meet the sensitivity requirements of today's high data rate technology. The receiver amplifies the input signal to the target signal level. Also, the data pulse width distortion needs to be minimized so that the integrity of the bitstream is maintained during amplification.

FIG. 2 illustrates an example of a differential receiver currently used in high speed data transmission. The differential receiver of FIG. 2 contains two P-channel metal-oxide semiconductor ("PMOS") transistors 20 and 22, and four N-channel metal-oxide semiconductor transistors ("NMOS") 24, 26, 28, and 29. Input signals $+V_{IN}$ 14 and $-V_{IN}$ 12 are received on the gates of NMOS transistors 28 and 29, respectively. When input signals 12 and 14 transition from low to high or from high to low the output signals $+V_{OUT}$ 200 and $-V_{OUT}$ 201 must also transition from low to high or high to low. This output signal transition is a "rail-to-rail" transition, i.e., the output signals transitions from $V_{DD}$ to ground or ground to $V_{DD}$.

One of the drawbacks of existing differential receivers, such as the one described with respect to FIG. 2, is the resulting distortion which occurs due to the rail-to-rail transition. This distortion results from a transition delay which occurs when transistors P20 or P22 operate in the triode region. Inherent in FIG. 2 is that the transition from a high signal to a low signal will be faster than transition from a low signal to a high signal because N28 and N29 are designed with a higher drive strength. This distortion in transition time results in a narrower pulse width when converted to a single logic signal, thereby distorting the data.

Additionally, other distortions may be introduced into the output signal as a result of internal circuit variations, such as process, temperature, power supplies and loading of additional circuits which may be coupled to the receiver.

Thus, a wide band differential receiver which reduces distortion and transition time, and which is not process or load dependent would represent an advancement in the art.

SUMMARY

Roughly described, an aspect of the present invention comprises a differential receiver circuit that includes a first signal input node, a second signal input node, a plurality of transistors coupled with the first signal input node and the second signal input node, and a signal conditioning device coupled with the plurality of transistors.

According to another aspect, a differential receiver circuit that includes a current source and a plurality of transistors is provided. Included in the plurality of transistors is a first transistor of a first conductivity type having a source region coupled to the current source, a drain region, and a gate, and a second transistor of the first conductivity type having a source region coupled to another current source, a drain region, and a gate coupled to the gate of the first transistor. Also included in the plurality of transistors is a third transistor of a second conductivity type having a drain region coupled to the drain region of the first transistor, a source region, and a gate, and a fourth transistor of the second conductivity type having a drain region coupled to the drain region of the second transistor, a source region, and a gate coupled to the gate of the third transistor. A first signal conditioning device having an input node coupled to the drain of the third transistor and the drain of the first transistor and an output node coupled to the drain of the fourth transistor and the drain of the second transistor is also included in the differential receiver. Additionally, a second signal conditioning device having an input node coupled to the drain of the fourth transistor and the drain of the second transistor and an output node coupled to the drain of the third transistor and the drain of the first transistor is described.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

Figure 1:
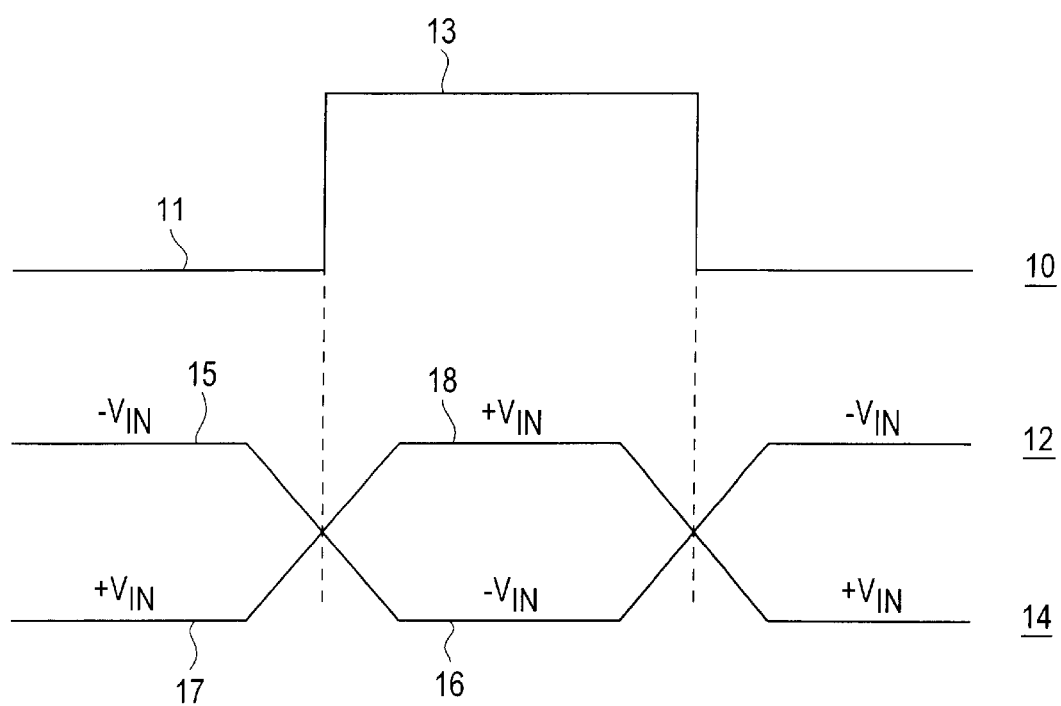
FIG. 1 illustrates one example of a single data signal represented by differential signals.
Figure 2:
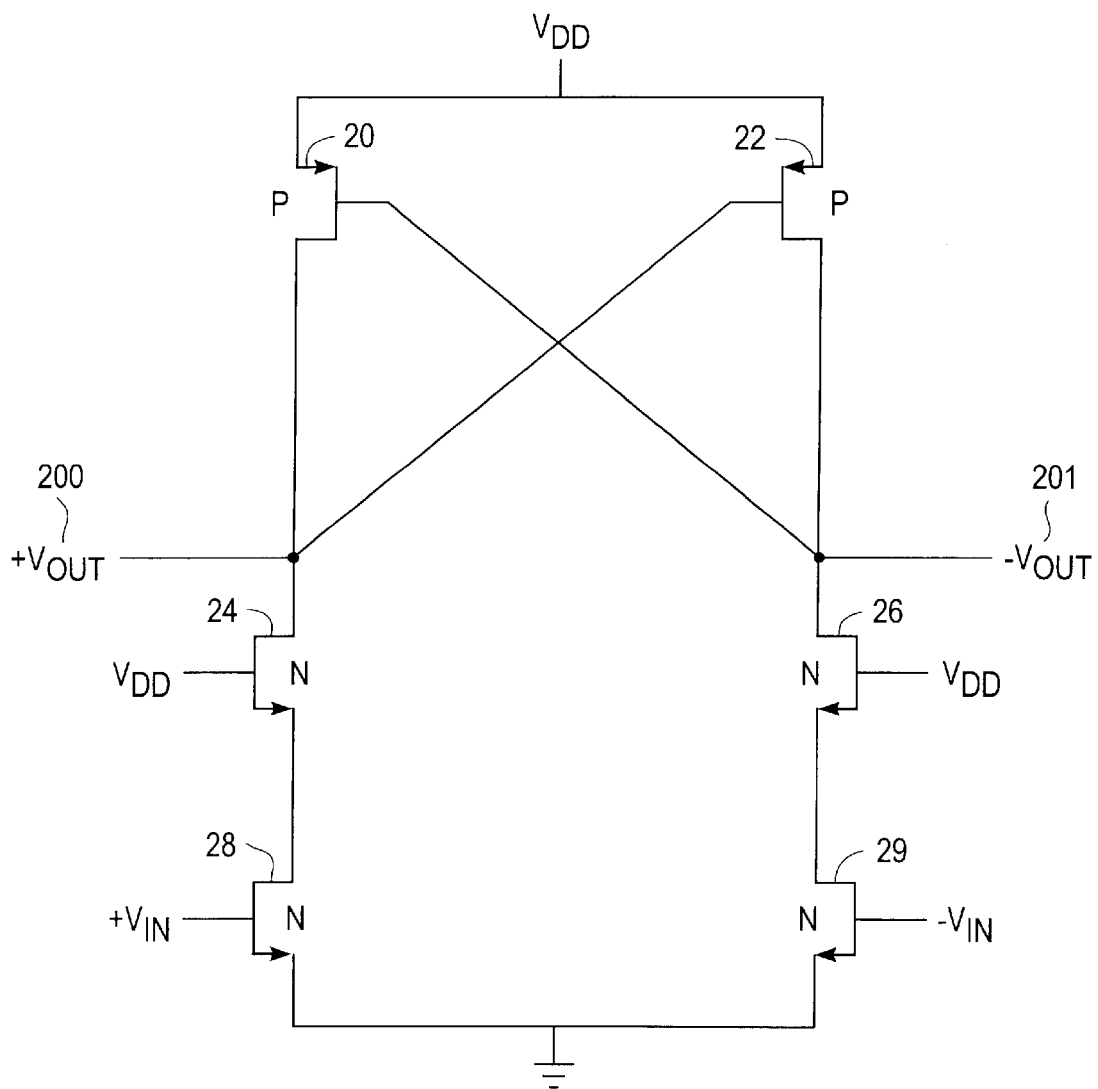
FIG. 2 illustrates an example of a prior art differential receiver.
Figure 3:
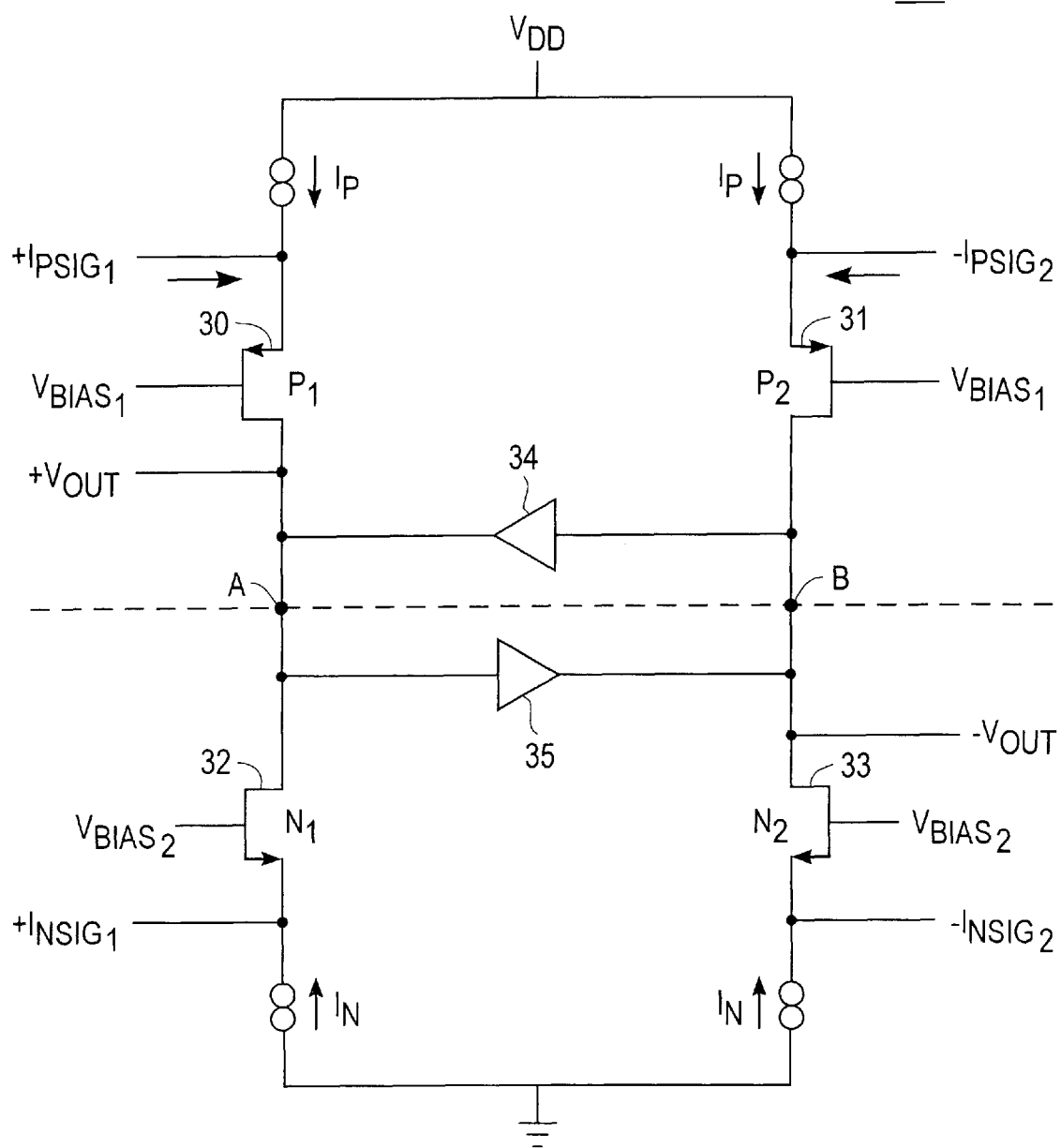
FIG. 3 illustrates a simplified example of a differential receiver, according to an embodiment of the present invention.

FIG. 3 illustrates a differential receiver, according to an embodiment of the present invention. The circuit of FIG. 3 includes PMOS transistors 30 and 31 and NMOS transistors 32 and 33. Also included in the receiver 300 is a pair of cross coupled signal conditioning devices 34 and 35. Signal conditioning devices 34 and 35 reduce transition time, and reduce signal distortion caused by transistors operating in the triode region. Signal conditioning devices 34, 35 may be NMOS devices, diodes or any other type of component which functions to reduce signal swing between two nodes.

Signal conditioning devices reduce transition time by reducing the high-to-low or low-to-high voltage swing. Instead of pulling $V_{OUT}$ close to ground or to $V_{DD}$, signal conditioning devices reduce this swing by keeping the high at a value below $V_{DD}$ and keeping the low value above ground, thereby reducing the transition time.

In addition to reducing signal swing, signal conditioning devices 34 and 35 ensure that transistors 30, 31, 32 and 33 each operate in the saturation region, thereby resulting in higher output impedance and gain. The improvement achieves higher data speed and reduces signal distortion by reducing transition time from low to high.

As an example, assume $+V_{OUT}$ is transitioning from high to low and $-V_{OUT}$ is transitioning from low to high. As the charge at node A increases and the charge at node B decreases, the change in voltage potential between node A and node B turns on device 34 or device 35 to allow the charge at node A to flow through signal conditioning device 35 to node B. Similarly, when transitioning from low to high, as the charge on node B increases and the charge at node A decreases, and the change in voltage potential between node B and node A turns on device 35 or device 34 to allow the charge at node B to flow through signal conditioning device 34.

Figure 4:
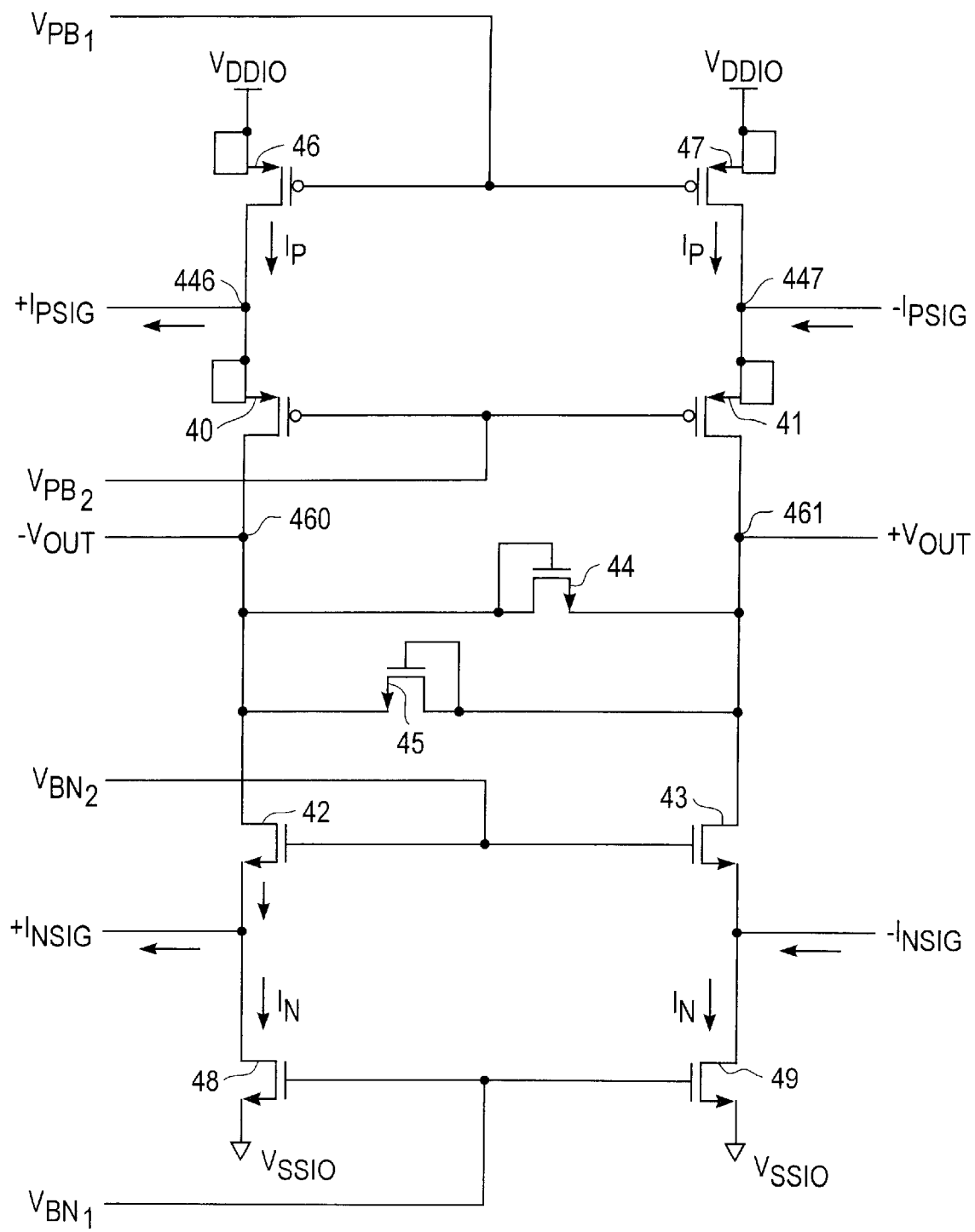
FIG. 4 illustrates a more detailed view of a differential receiver, according to an embodiment of the invention; and, FIG. 5 illustrates a differential receiver coupled to a second stage differential to single signal circuit.

FIG. 4 illustrates a more detailed view of a differential receiver according to an embodiment of the present invention. The circuit in FIG. 4 includes PMOS transistors 40, 41, 46, 47, and NMOS transistors 42, 43, 48, 49. Signal conditioning devices 34 and 35 (shown in FIG. 3) are, in this embodiment, a pair of cross-coupled NMOS transistors 44 and 45.

The gate of transistors 46 and 47 are coupled together and receive, from another circuit, a voltage $V_{PB1}$. The source of each transistor 46 and 47 receives a supply voltage $V_{DDIO}$, and a current $I_p$ flows through each transistor. Similarly, the gate of transistors 40 and 41 are coupled together and receive, from another circuit, a voltage $V_{PB2}$. The source of transistor 40 is coupled to the drain of transistor 46 and $+I_{PSIG}$ node 446 and receives the current difference between $I_P$ and $+I_{PSIG}$. The source of transistor 41 is coupled to the drain of transistor 47 and $-I_{PSIG}$ node 447 and receives the current sum of $I_p$ and $I_{PSIG}$.

The gate of transistors 48 and 49 are coupled together and receive, from another circuit, a voltage $V_{BN1}$. The source of each transistor 48 and 49 are at $V_{SSIO}$, which may be ground. The gate of each transistor 42 and 43 are coupled together and receive, from another circuit, a voltage $V_{BN2}$. The drain of transistor 48 is coupled to the source of transistor 42 and receives current $I_N$. Likewise, the drain of transistor 49 is coupled to the source of transistor 43 and receives current $I_N$.

The drain of transistor 40 and the drain of transistor 42 are coupled together at $-V_{OUT}$ node 460 which also has the drain and gate of transistor 44 and the source of transistor 45 coupled to it. The drain of transistor 41 and the drain of transistor 43 are coupled together at $+V_{OUT}$ node 461 which has the source of transistor 44 and the drain and gate of transistor 45 coupled to it.

With the circuitry illustrated in FIG. 4, as the charge on $-V_{OUT}$ increases and the charge on $+V_{OUT}$ decreases, a voltage potential difference is produced between $-V_{OUT}$ and $+V_{OUT}$. When the voltage difference is high enough, transistor 44 is turned on and the charge flows toward $+V_{OUT}$, thereby keeping transistors 40, 41, 42, 43, 46, 47, 48, 49 in saturation mode and reducing the voltage difference. As discussed above, keeping the transistors in saturation mode and reducing swing voltage reduces signal distortion thereby preserving signal integrity.

Figure 5:
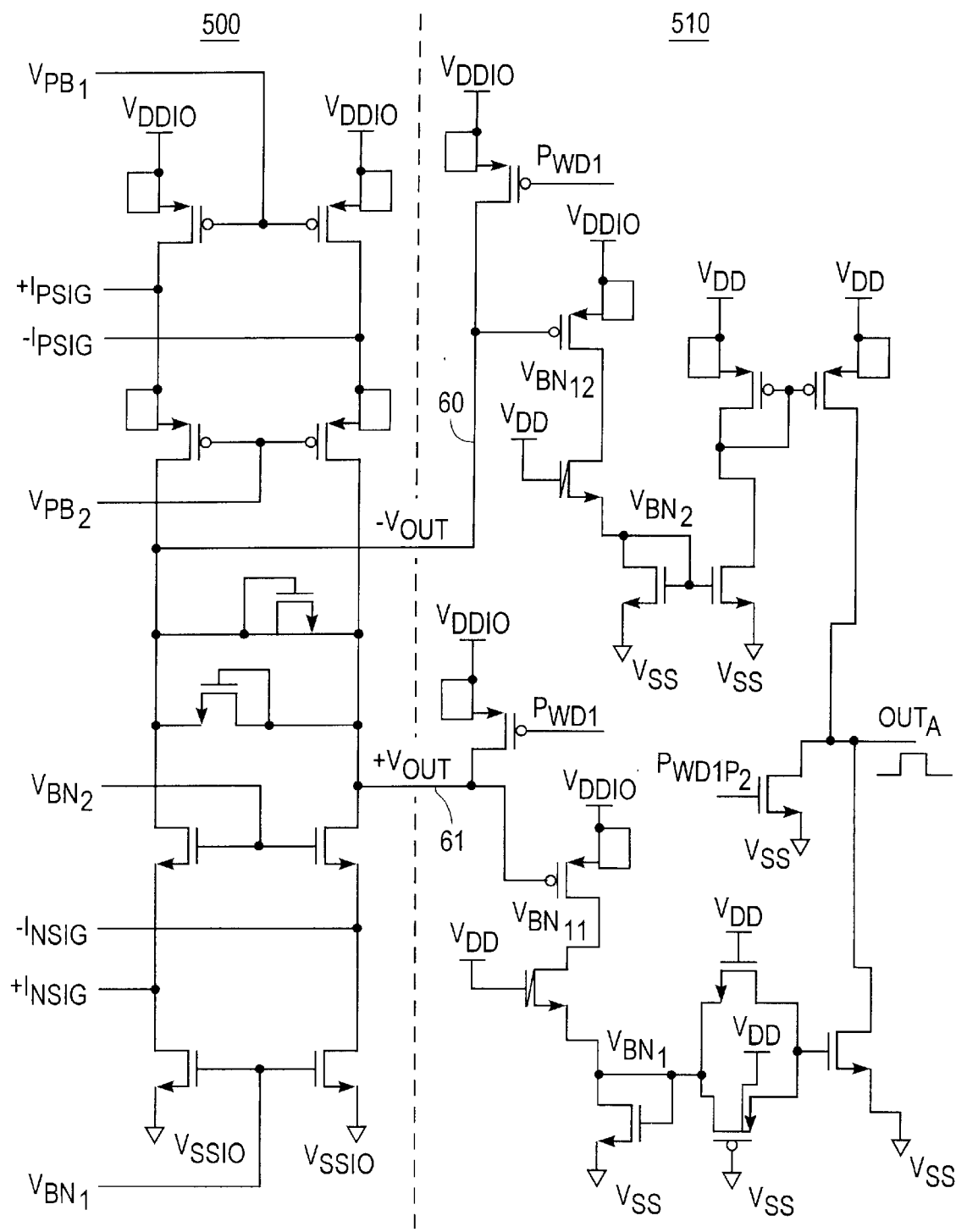

FIG. 5 illustrates the differential receiver 500, described with respect to FIG. 4, coupled to a second stage differential to single signal circuit 510, according to an embodiment of the present invention. The second stage circuit 600 receives the differential signals $-V_{OUT}$ and $+V_{OUT}$ on input lines 60 and 61, respectively. The differential signals are then converted to a single data signal at the desired output level and provided to another circuit. In an embodiment, the differential signals $-V_{OUT}$ 60 and $+V_{OUT}$ 61 are processed individually to a smaller voltage swing with a small supply $V_{DD}$ as the maximum swing in circuit 510. The negative signal 60 takes one extra inversion on the signal path to accomplish the final in-phase output. The devices Mop1 and Mon1 convert the push/pull signals at the gates of these devices to a single-ended output. A transmission gate is used in the positive signal path to match the delay in the negative path to minimize pulse width distortion.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A differential receiver circuit comprising:

a first current source;

a second current source;

a first transistor of a first conductivity type having a source region coupled to said first current source, a drain region, and a gate;

a second transistor of said first conductivity type having a source region coupled to said second current source, a drain region, and a gate coupled to said gate of said first transistor;

a third transistor of a second conductivity type having a drain region coupled to said drain region of said first transistor, a source region, and a gate;

a fourth transistor of said second conductivity type having a drain region coupled to said drain region of said second transistor, a source region, and a gate coupled to said gate of said third transistor;

a first signal conditioning device, having an input node coupled to said drain of said third transistor and the drain of said first transistor and an output node coupled to said drain of said fourth transistor and the drain of said second transistor; and a second signal conditioning device, having an input node coupled to said drain of said fourth transistor and the drain of said second transistor and an output node coupled to said drain of said third transistor and the drain of said first transistor.

2. The differential receiver circuit of claim 1, wherein said first transistor and said second transistor are P-channel metal-oxide semiconductor transistors.

3. The differential receiver circuit of claim 1, wherein said third transistor and said fourth transistor are N-channel metal-oxide semiconductor transistors.

4. The differential receiver circuit of claim 1, wherein said first signal conditioning device and said second signal conditioning device are N-channel metal-oxide semiconductor transistors.

5. The differential receiver circuit of claim 1, wherein said first signal conditioning device and said second signal conditioning device are diodes.

6. A differential receiver circuit comprising:

a first current source;

a second current source;

a first transistor of a first conductivity type having a source region coupled to said first current source, a drain region, and a gate;

a second transistor of said first conductivity type having a source region, a drain region, and a gate coupled to said gate of said first transistor;

a third transistor of a second conductivity type having a drain region coupled to said drain region of said first transistor, a source region coupled to said second current source, and a gate;

a fourth transistor of said second conductivity type having a drain region coupled to said drain region of said second transistor, a source region, and a gate coupled to said gate of said third transistor;

a first signal conditioning device, having an input node coupled to said drain of said third transistor and the drain of said first transistor and an output node coupled to said drain of said fourth transistor and the drain of said second transistor; and a second signal conditioning device, having an input node coupled to said drain of said fourth transistor and the drain of said second transistor and an output node coupled to said drain of said third transistor and the drain of said first transistor.

7. The differential receiver circuit of claim 6, wherein said first transistor and said second transistor are P-channel metal-oxide semiconductor transistors.

8. The differential receiver circuit of claim 6 wherein said third transistor and said fourth transistor are N-channel metal-oxide semiconductor transistors.

9. The differential receiver circuit of claim 6, wherein said first signal conditioning device and said second signal conditioning device are N-channel metal-oxide semiconductor transistors.

10. The differential receiver circuit of claim 6, wherein said first signal conditioning device and said second signal conditioning device are diodes.

* * * * *